United States Patent
Chueh et al.

(10) Patent No.: US 9,159,918 B2
(45) Date of Patent: Oct. 13, 2015

(54) RESISTIVE RANDOM ACCESS MEMORY

(71) Applicant: National Tsing Hua University, Hsinchu (TW)

(72) Inventors: Yu-Lun Chueh, Hsinchu (TW); Chi-Hsin Huang, Hsinchu (TW)

(73) Assignee: National Tsing Hua University, Hsinchu (TW)

(*) Notice: Subject to any disclaimer, the term of this patent is extended or adjusted under 35 U.S.C. 154(b) by 103 days.

(21) Appl. No.: 14/150,028

(22) Filed: Jan. 8, 2014

(65) Prior Publication Data
US 2014/0191183 A1    Jul. 10, 2014

(30) Foreign Application Priority Data
Jan. 8, 2013 (TW) .............................. 102100630 A

(51) Int. Cl.
*H01L 45/00* (2006.01)
*H01L 27/24* (2006.01)
*B82Y 30/00* (2011.01)

(52) U.S. Cl.
CPC .............. *H01L 45/146* (2013.01); *H01L 45/04* (2013.01); *H01L 45/1233* (2013.01); *H01L 45/1608* (2013.01); *B82Y 30/00* (2013.01); *H01L 27/2418* (2013.01); *H01L 27/2463* (2013.01)

(58) Field of Classification Search
CPC .... H01L 45/04; H01L 45/146; H01L 27/2463
See application file for complete search history.

(56) References Cited

U.S. PATENT DOCUMENTS

| | | | |
|---|---|---|---|
| 6,946,702 B2 * | 9/2005 | Jang | 257/306 |
| 2004/0245557 A1 * | 12/2004 | Seo et al. | 257/298 |
| 2005/0153504 A1 * | 7/2005 | Kawazoe et al. | 438/222 |
| 2008/0268288 A1 * | 10/2008 | Jin | 428/800 |
| 2010/0001267 A1 | 1/2010 | Manning et al. | |
| 2011/0260290 A1 | 10/2011 | Kalra et al. | |

FOREIGN PATENT DOCUMENTS

| | | |
|---|---|---|
| TW | 200931639 A | 7/2009 |
| TW | 201003899 A | 1/2010 |
| TW | 201040324 A | 11/2010 |
| TW | 201212319 A | 3/2012 |
| WO | 2008/119138 A1 | 10/2008 |

* cited by examiner

Primary Examiner — Thanh V Pham
(74) Attorney, Agent, or Firm — Muncy, Geissler, Olds & Lowe, P.C.

(57) ABSTRACT

A resistive random access memory includes a first electrode, a second electrode and a first metal oxide composite layer. The second electrode is opposite to the first electrode. The first metal oxide composite layer is disposed between the first electrode and the second electrode. The first metal oxide composite layer has a film layer and a nanorod structure.

10 Claims, 9 Drawing Sheets

RESISTIVE RANDOM ACCESS MEMORY

CROSS REFERENCE TO RELATED APPLICATIONS

This Non-provisional application claims priority under 35 U.S.C. §119(a) on Patent Application No(s). 102100630 filed in Taiwan, Republic of China on Jan. 8, 2013, the entire contents of which are hereby incorporated by reference.

BACKGROUND OF THE INVENTION

1. Field of Invention

The present invention relates to a resistive random access memory (RRAM) and, in particular, to an RRAM having the characteristics of a diode and a resistive memory.

2. Related Art

Non-volatile memories have been widely used in many portable electronic devices such as cell phones, digital cameras, PDAs, notebook computers since they does not need continuous power to maintain the writing states and have lower power consumption. In various kinds of non-volatile memories, the flash RAM having the properties of fast writing and fast erasing is one of the most popular products. However, since the smaller size cells are developed, the flash RAM definitely encounters the challenges of large writing voltage, long writing time, and short registering time due to the thinner gate. Accordingly, it is desired to develop new non-volatile memories to substitute the flash RAM. Among the new non-volatile memories, the RRAM has drawn the researcher's attentions since it has the advantages of short writing and erasing time, low operation voltage and current, long retention time, multiple state storage, simple structure, simple writing and reading process, and small cell size. In other words, the RRAM is the most potential technique and is the critical research in non-volatile memories.

When the RRAM is applied to the 3D high-density crossbar structure memory cell array, the interference between the elements may occur. Thus, a selective element, such as a transistor or a diode, is needed to connect with the RRAM. In the present researches, a diode is a preferred selective element for the RRAM. Since the diode is made of oxide, which can be formed without high-temperature processes and has good rectification property, it can used as a perfect selective element. Therefore, the one diode-one resistor (1D1R) device is considered as a simplest memory cell and it is the most potential structure for developing non-volatile memories.

However, a general PN junction diode is composed of a P-type oxide and an N-type oxide, and it is not easy to control the compositions of these two oxide layers. In addition, the problem of unstable operation voltage and resistance states of RRAM may easily generate errors in operation.

Therefore, it is an important subject to provide a RRAM that can overcome the above problems and provide the excellent performance.

SUMMARY OF THE INVENTION

In view of the foregoing subject, an objective of the present invention is to provide an RRAM that has stable operation voltage and resistance states and better performance as well as the low-cost manufacturing processes.

To achieve the above objective, the present invention discloses a resistive random access memory (RRAM), which comprises a first electrode, a second electrode, and a first metal oxide composite layer. The second electrode is opposite to the first electrode. The first metal oxide composite layer is disposed between the first electrode and the second electrode. The first metal oxide composite layer has a film layer and a nanorod structure.

In one embodiment of the invention, the nanorod structure comprises a plurality of nanorods, and the longitudinal axis of at least one of the nanorods is substantially perpendicular to the film layer.

In one embodiment of the invention, at least part of the nanorod structure is disposed between the second electrode and the film layer.

In one embodiment of the invention, the material of the film layer and the nanorod structure comprises ZnO, NiO, $TiO_2$, $CuO_X$, $WO_X$, $FeO_X$, $HfO_2$, $TaO_X$ or $SrTiO_X$.

In one embodiment of the invention, the film layer and the nanorod structure are made of the same material or different materials.

In one embodiment of the invention, the film layer has a first thickness ranged between 25 nm and 200 nm, and the nanorod structure has a second thickness ranged between 50 nm and 500 nm.

In one embodiment of the invention, the film layer is disposed on the first electrode by sputtering, and the nanorod structure is disposed on the film layer by chemical bath deposition or hydrothermal method.

In one embodiment of the invention, the material of the first electrode and the second electrode comprises Pt, Pd, Os, Ir, Rh, Ru, Ti, Cu, Al, Ni, Au, Ag, or their combinations.

In one embodiment of the invention, the RRAM further comprises a substrate, and the first electrode is disposed on the substrate.

In one embodiment of the invention, the RRAM is a non-volatile memory.

In one embodiment of the invention, the RRAM further comprises a second metal oxide composite layer and a third electrode. The first and second metal oxide composite layers are disposed at two sides of the first electrode, respectively. The third electrode is disposed at one side of the second metal oxide composite layer away from the first electrode.

As mentioned above, the first metal oxide composite layer of the RRAM has a film layer and a nanorod structure. The film layer is formed by sputtering, while the nanorod structure is formed by chemical bath deposition or hydrothermal method. Since these processes including sputtering, chemical bath deposition and hydrothermal method are room-temperature processes, so that the fabrication of the RRAM of the invention is simpler and has lower cost. In addition, the RRAM of the invention includes the characteristics of diode and resistive memory. Accordingly, the operation voltage and resistance states are more stable, and the operation voltage thereof is smaller, which decreases the power consumption.

BRIEF DESCRIPTION OF THE DRAWINGS

The invention will become more fully understood from the detailed description and accompanying drawings, which are given for illustration only, and thus are not limitative of the present invention, and wherein.

DETAILED DESCRIPTION OF THE INVENTION

Figure 1:
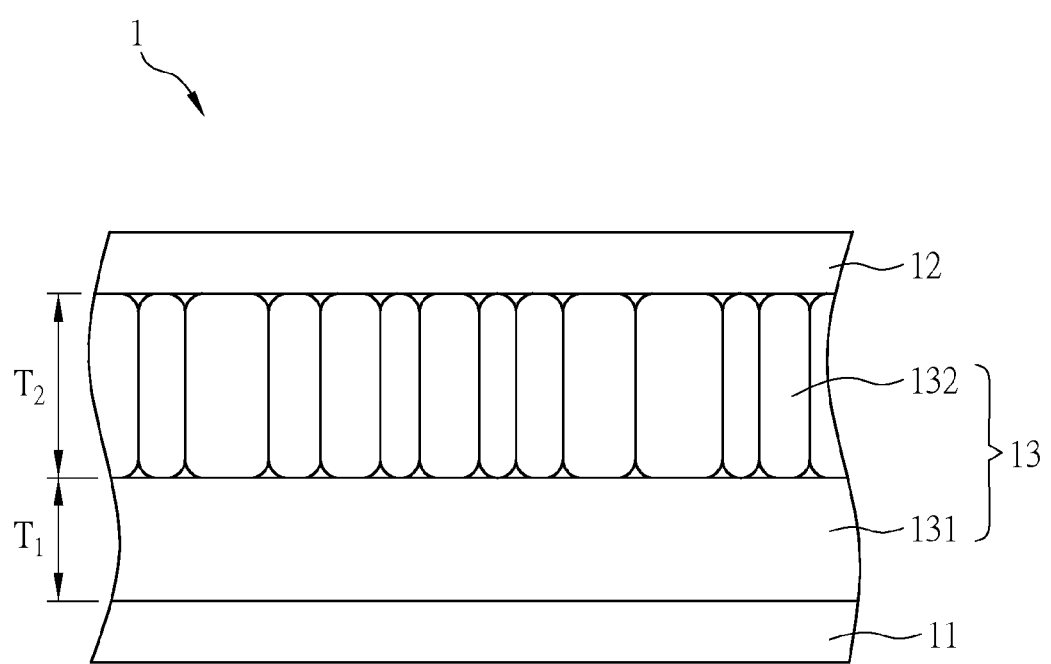
FIG. 1 is a schematic diagram showing a RRAM according to a preferred embodiment of the invention.

The present invention will be apparent from the following detailed description, which proceeds with reference to the accompanying drawings, wherein the same references relate to the same elements. To be noted, the structures, scales and dimensions of the elements in the drawings are only for illustrating those described in the specification to be understood and read by those skilled in the art, and are not to limit the invention. Any structure modification, scale change, or dimension adjustment without affecting the function and goal of the invention are considered within the scope of the present invention.

FIG. 1 is a schematic diagram showing a resistive random access memory (RRAM) 1 according to a preferred embodiment of the invention. The RRAM 1 is a non-volatile memory and includes a first electrode 11, a second electrode 12 and a first metal oxide composite layer 13.

The first electrode 11 is disposed opposite to the second electrode 12. The material of the first electrode 11 and the second electrode 12 may include Pt, Pd, Os, Ir, Rh, Ru, Ti, Cu, Al, Ni, Au, Ag, or their combinations, or any other precious metal. The first electrode 11 and the second electrode 12 can be made of the same material or different materials. In this embodiment, the first electrode 11 and the second electrode 12 are all made of, for example but not limited to, Pt.

The first metal oxide composite layer 13 is disposed between the first electrode 11 and the second electrode 12. Besides, the first metal oxide composite layer 13 has a film layer 131 and a nanorod structure 132. The film layer 131 is disposed on the first electrode 11, and the nanorod structure 132 is disposed on the film layer 131. At least part of the nanorod structure 132 is disposed between the second electrode 12 and the film layer 131. The nanorod structure 132 includes a plurality of nanorods, which are arranged side by side in radial. The longitudinal axis of at least one nanorod is substantially perpendicular to the major plane direction of the film layer 131. The material of the film layer 131 and the nanorod structure 132 includes ZnO, NiO, TiO$_2$, CuO$_X$, WO$_X$, FeO$_X$, HfO$_2$, TaO$_X$, SrTiO$_X$, or other metal oxides. The film layer 131 and the nanorod structure 132 can be made of the same material or different materials. In this embodiment, the film layer 131 and the nanorod structure 132 are made of for example but not limited to, ZnO.

The first metal oxide composite layer 13 is formed on the first electrode 11 by a low-temperature process. In more detailed, the film layer 131 is disposed on the first electrode 11 by sputtering (e.g. low-temperature vacuum sputtering), and the nanorod structure 132 is disposed on the film layer 131 by chemical bath deposition or hydrothermal method. Since these processes including sputtering, chemical bath deposition and hydrothermal method are room-temperature processes, so that the fabrication of the first metal oxide composite layer 13 is simpler and has lower cost.

The film layer 131 has a first thickness $T_1$, and the nanorod structure 132 has a second thickness $T_2$. When the thickness of the first metal oxide composite layer 13 is insufficient, the RRAM 1 easily has the current leakage issue and is thus shorted. Otherwise, when the thickness of the first metal oxide composite layer 13 is too thick, the larger operation voltage is required. Preferably, the first thickness $T_1$ is ranged between 25 nm and 200 nm, and the second thickness $T_2$ is ranged between 50 nm and 500 nm. In this embodiment, the first thickness $T_1$ of the film layer 131 is 100 nm, and the second thickness $T_2$ of the nanorod structure 132 is 150 nm.

Figure 2:
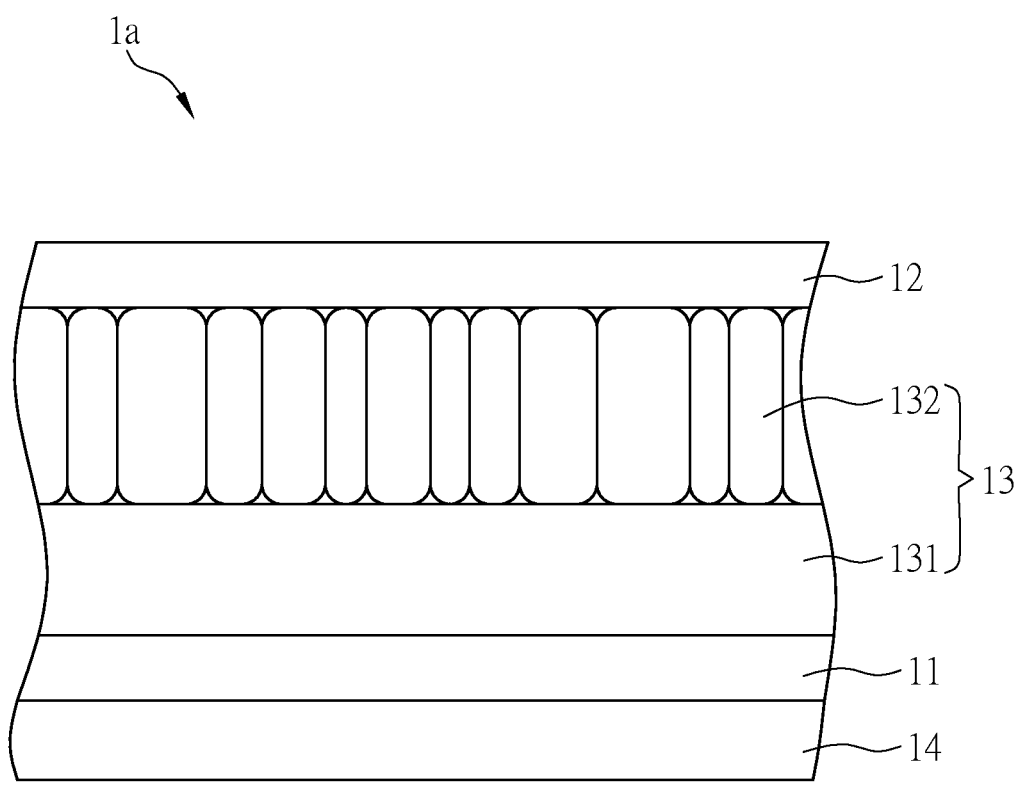
FIG. 2 is a schematic diagram showing another RRAM of the invention.

FIG. 2 is a schematic diagram showing another RRAM 1$a$ of the invention. The RRAM 1$a$ further includes a substrate 14, and the first electrode 11 is disposed on the substrate 14. The material of the substrate 14 includes aluminum oxide, aluminum nitride, silicon carbide, silicon, copper metal or alloy, aluminum metal or alloy, glass, or the likes. Herein, the substrate 14 is configured for supporting the first electrode 11, and it can be removed if necessary.

With reference to FIG. 1, the RRAM 1 includes both the characteristics of a diode and a conventional resistive memory. Since the manufacturing processes of the nanorod structure 132 and the film layer 131 are different, the defect amounts in the nanorod structure 132 and the film layer 131 are different. Thus, the interface between the nanorod structure 132 and the first electrode 11 and the interface between the film layer 131 and the second electrode 12 are different. After connecting the nanorod structure 132 and the film layer 131, the different interfaces of the first electrode 11 and the second electrode 12 allow the RRAM 1 to equip a diode characteristic for providing good rectification property. In this case, the provided diode is a Schottky diode. Compared with the conventional P-N junction diode, this invention can use a single material to form a resistive memory with diode property. Thus, the manufacturing process of the invention is simpler and easily operated and controlled.

Figure 3:
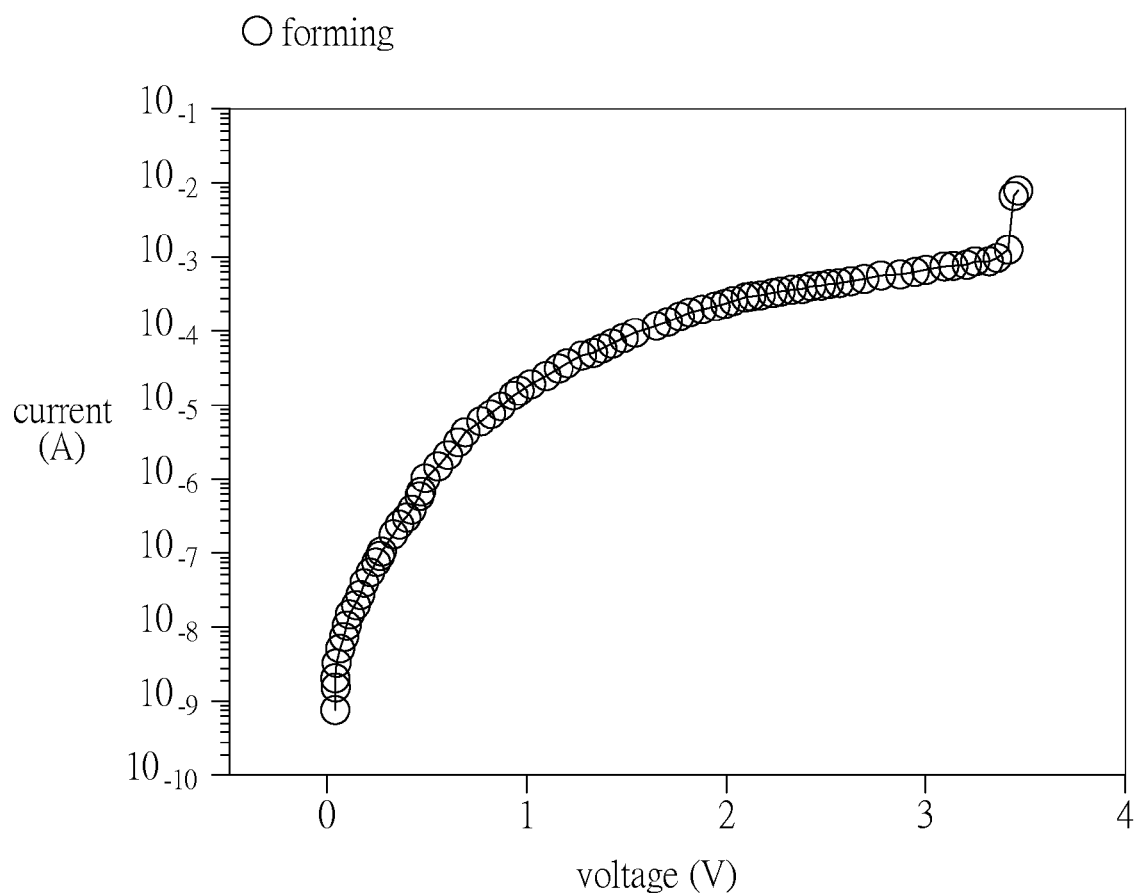
FIG. 3 is a graph showing the current-voltage curve during the forming process of the RRAM of the invention.
Figure 4:
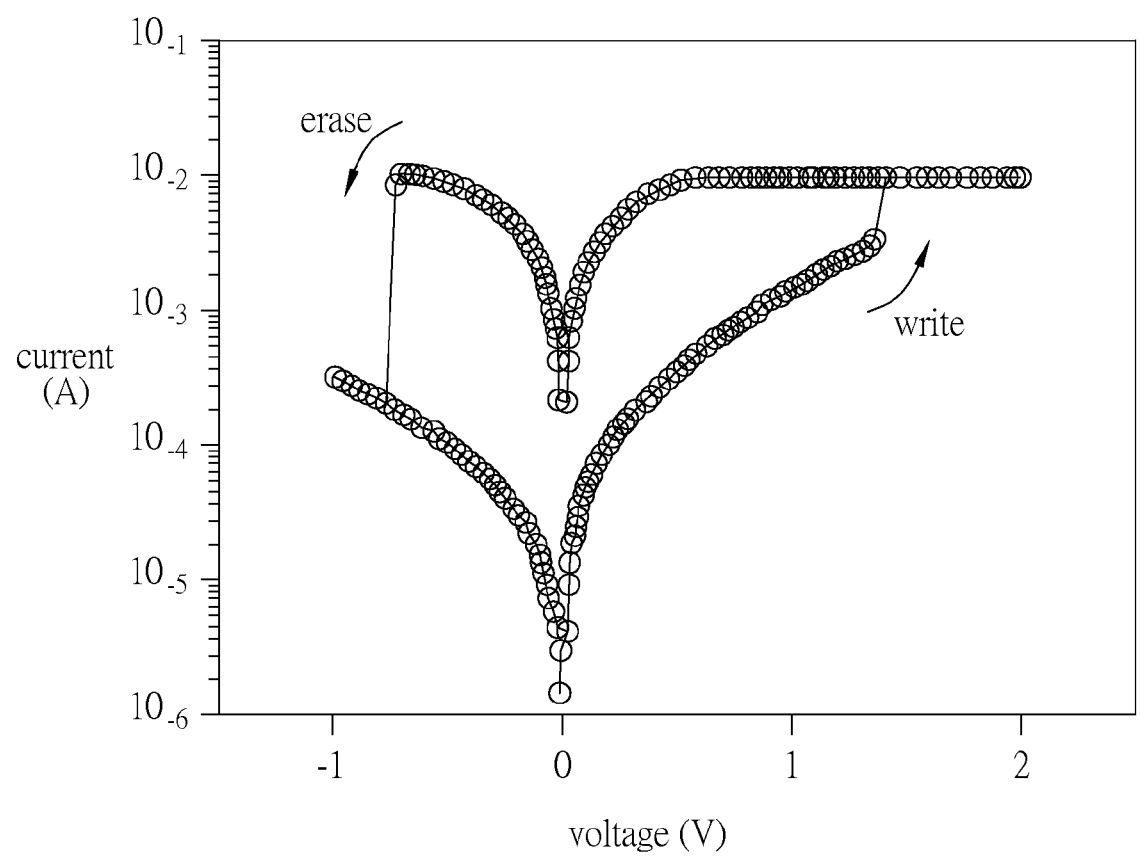
FIG. 4 is a graph showing the current-voltage curve during writing/erasing of the RRAM of the invention.

The RRAM 1 of the invention is suitable for the unipolar operation and the bipolar operation. FIG. 3 is a graph showing the current-voltage curve during the forming process of the RRAM 1 of the invention, and FIG. 4 is a graph showing the current-voltage curve during writing/erasing of the RRAM 1 of the invention. As shown in FIG. 3, the forming voltage of the RRAM 1 is about 3.5V. As shown in FIG. 4, the write (or SET) voltage of the RRAM 1 is about 1.3V, and the erase (or RESET) voltage thereof is about 0.8V Compared with the write voltage (2.1 V) and the erase voltage (0.8V) of the conventional resistive memory without configuring the nanorod structure, the forming voltage of the RRAM 1 of the invention is relatively much lower.

Figure 5:
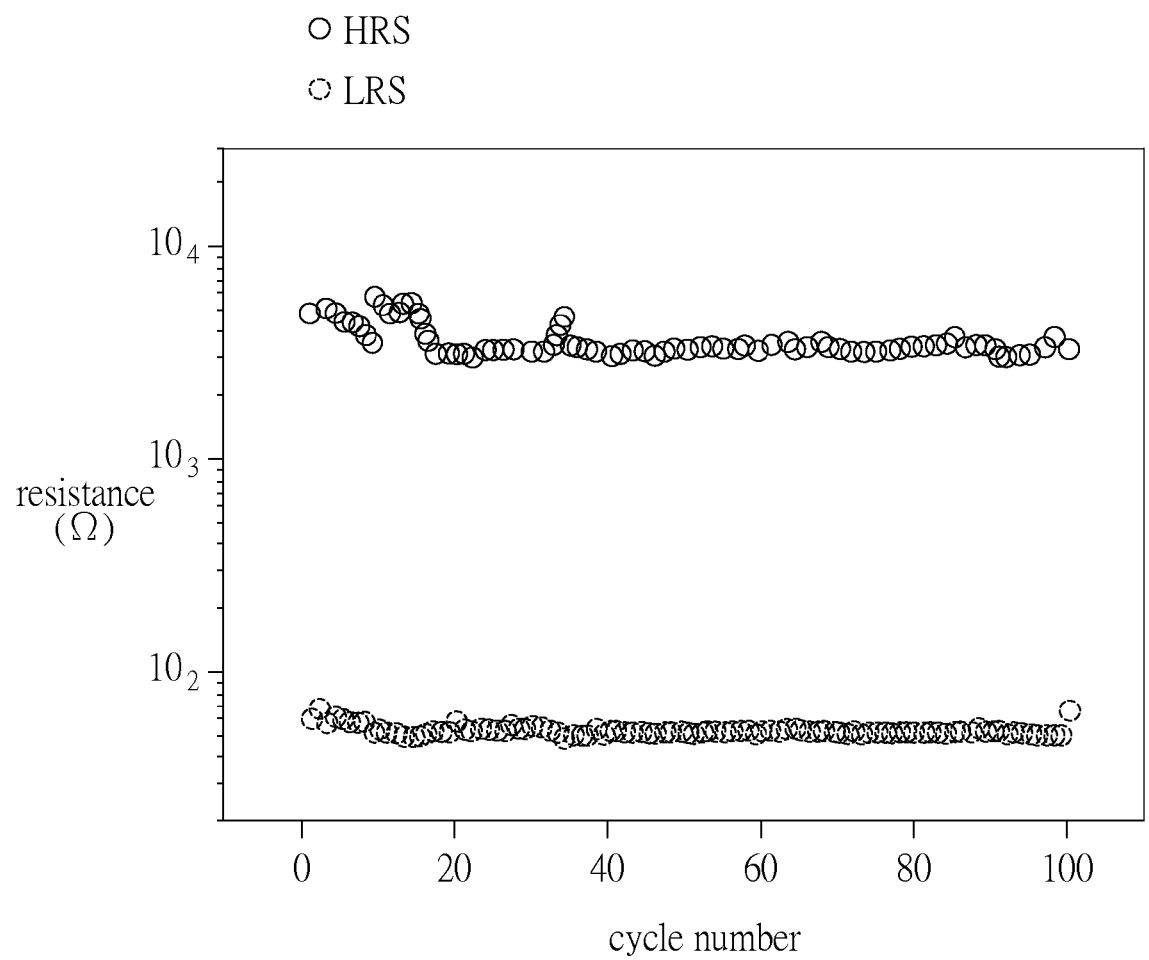
FIG. 5 is a schematic diagram showing the resistance-cycle number curve of the RRAM of the invention.
Figure 6:
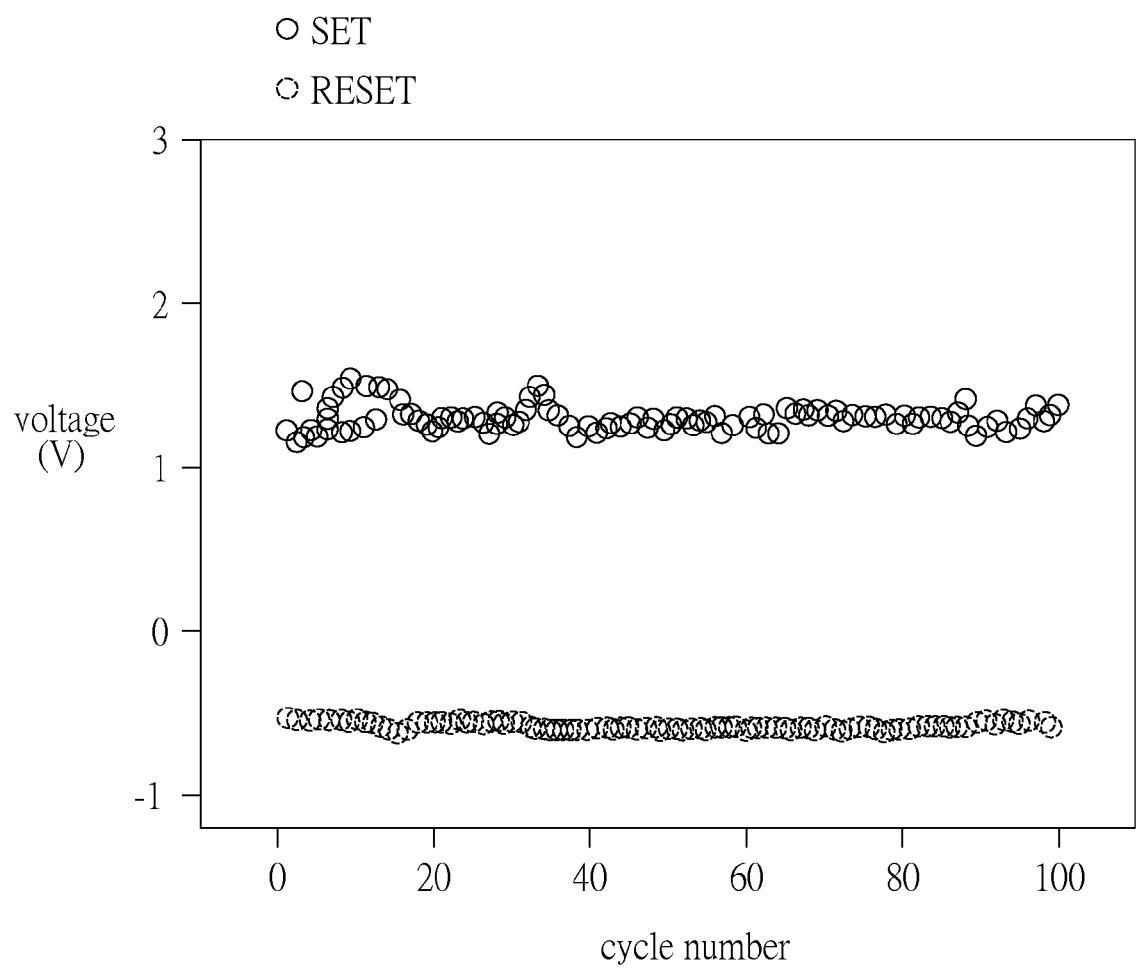
FIG. 6 is a schematic diagram showing the endurance test results of the RRAM of the invention.

FIG. 5 is a schematic diagram showing the endurance test result of the RRAM of the invention, and FIG. 6 is a schematic diagram showing the operation voltage-cycle number plot of the RRAM of the invention. Referring to FIG. 5, the operation resistance of high resistance state (HRS) is about $4 \times 10^3 \Omega$, and the operation resistance of low resistance state (LRS) is about 50$\Omega$. Referring to FIG. 6, the set voltage is about 1.3V, and the reset voltage is about –0.6V. As shown in the figures, after the cycle number reaches 20, the operation voltage and resistance states of the RRAM of the invention approach to steady. Compared with the HRS ($2 \times 10^3$ to $8 \times 10^3$) and the SET voltage (1.2V to 2.5V) of the conventional resistive memory without configuring the nanorod structure, the operation voltage and resistance states of the RRAM1 of the invention are more stable. Moreover, the operation voltage of the invention is smaller, so that the power consumption of the RRAM 1 can be decreased.

Figure 7:
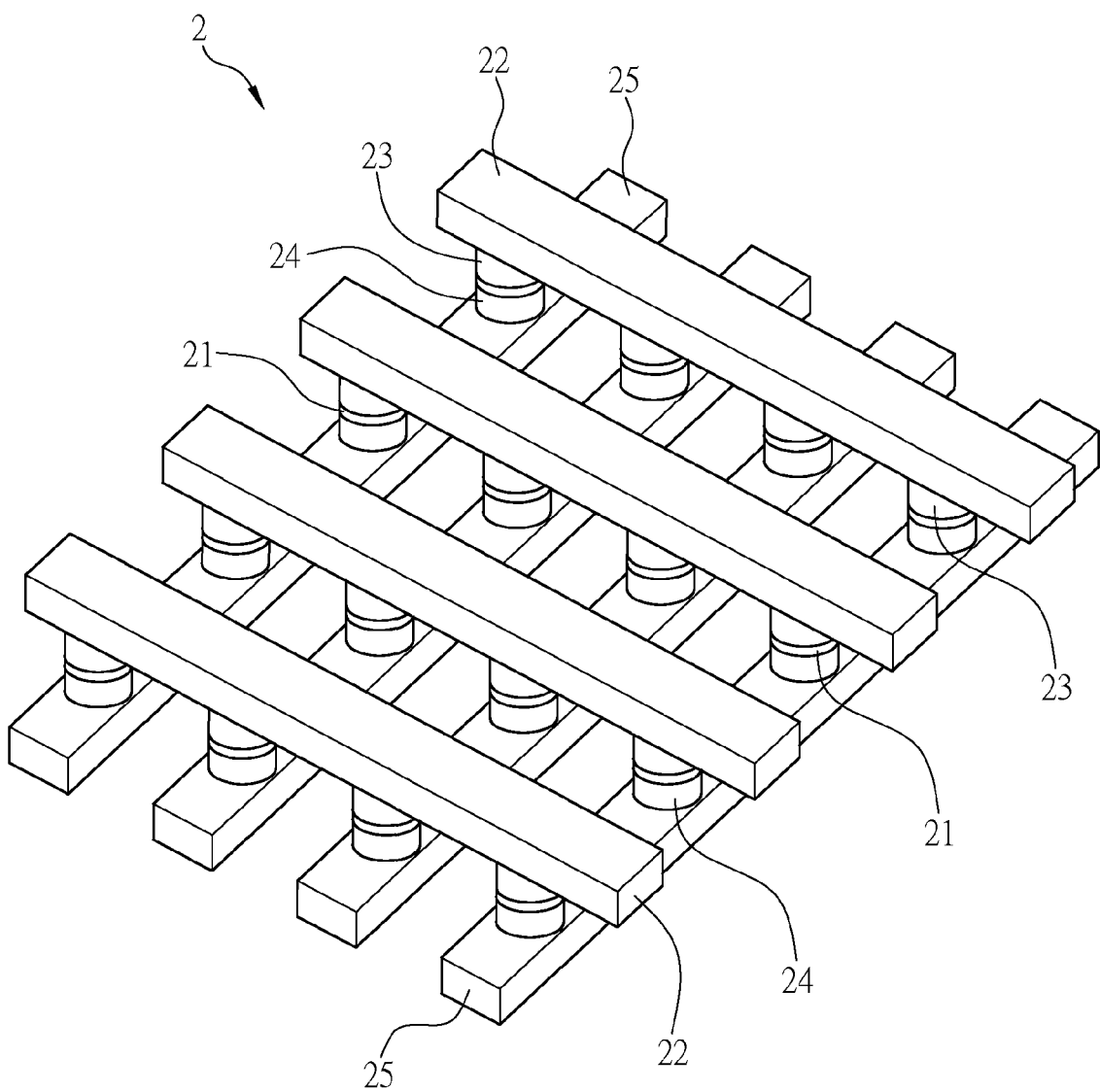
FIG. 7 is a schematic diagram showing the RRAM of the invention applied to 3D high-density crossbar structure memory cell array.
Figure 8:
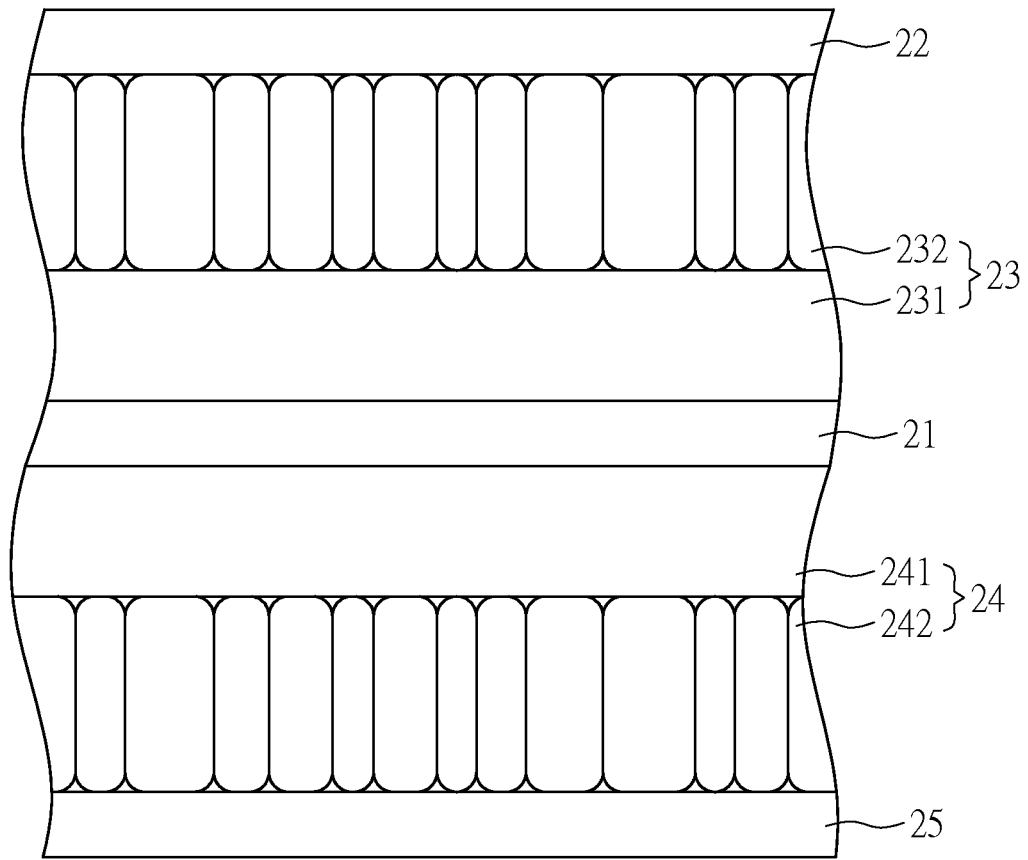
FIG. 8 is a schematic diagram showing a memory cell of FIG. 7.

FIG. 7 is a schematic diagram showing the RRAM of the invention applied to 3D high-density crossbar structure memory cell array, and FIG. 8 is a schematic diagram showing a memory cell of FIG. 7. Referring to FIGS. 7 and 8, the RRAM 2 includes a first electrode 21, a second electrode 22, a first metal oxide composite layer 23, a second metal oxide composite layer 24, and a third electrode 25. Herein, the technical features of the first metal oxide composite layer 23 and the second metal oxide composite layer 24 are the same as those of the first metal oxide composite layer 13 of the previous embodiment, the technical features of the second electrode 22 and the third electrode 25 are the same as those of the second electrode 12 of the previous embodiment, and the technical features of the first electrode 21 are the same as those of the first electrode 11 of the previous embodiment. Thus, the detailed descriptions thereof will be omitted.

To be noted, the first metal oxide composite layer 23 and the second metal oxide composite layer 24 are disposed at two sides of the first electrode 21, and the third electrode 25 is disposed at one side of the second metal oxide composite layer 24 away from the first electrode 21. In more detailed, the film layers 231 and 241 of the first metal oxide composite layer 23 and the second metal oxide composite layer 24 are disposed at two sides of the first electrode 21, respectively. The nanorod structures 232 and 242 of the first metal oxide composite layer 23 and the second metal oxide composite layer 24 are disposed on the film layers 231 and 241, respectively. Then, the second electrode 22 and the third electrode 25 are disposed on the nanorod structures 232 and 242 and serve as the top and bottom electrodes. Each memory cell of the RRAM 2 includes the characteristics of a diode and a resistive memory. In this embodiment, the second metal oxide composite layer 24 can provide the characteristic of a diode, and the first metal oxide composite layer 23 can provide the characteristic of a resistive memory.

Figure 9:
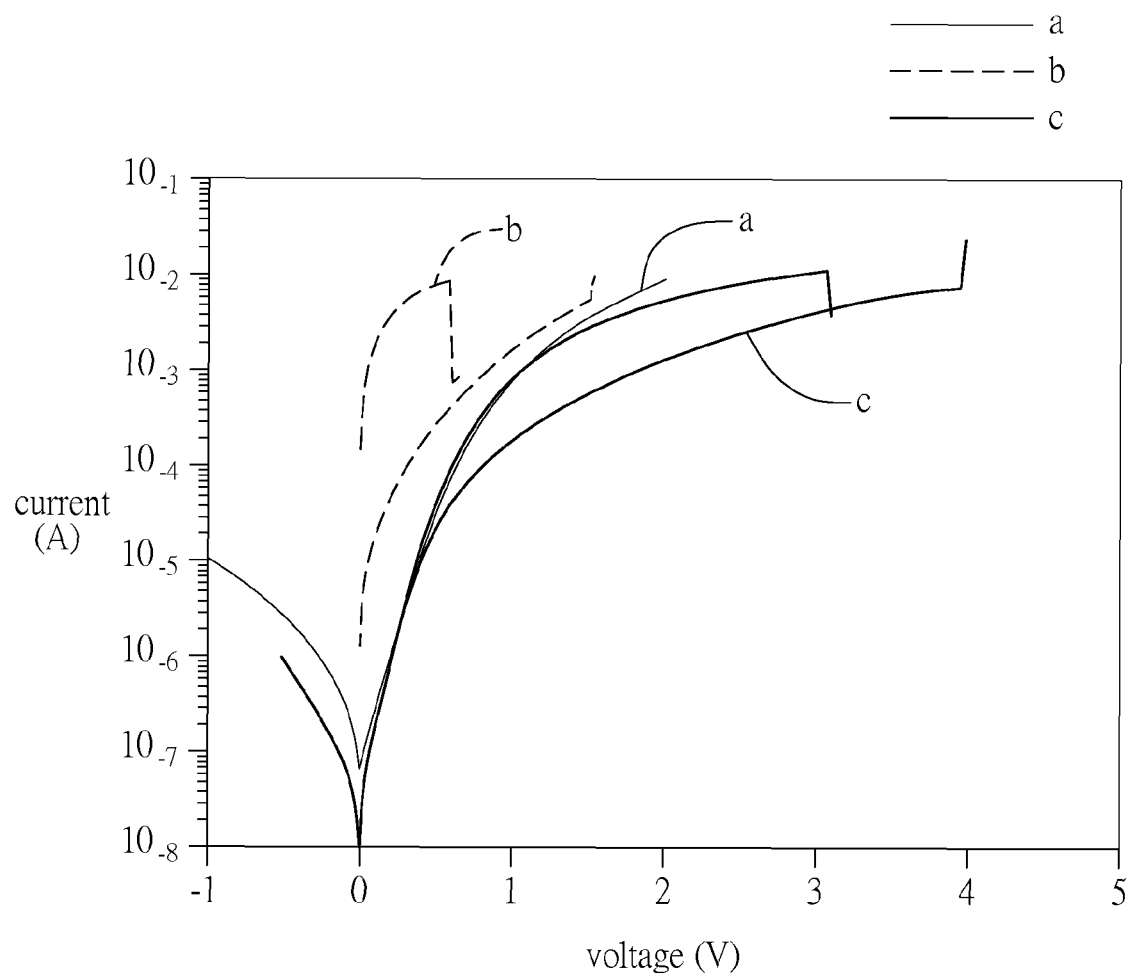
FIG. 9 is a graph showing the voltage-current curve of the RRAM of FIG. 8.

FIG. 9 is a graph showing the voltage-current curve of the RRAM of FIG. 8. As shown in FIG. 9, the curve a indicates the characteristic curve of a diode, the curve b indicates the characteristic curve of a resistive memory, and the curve c indicates the characteristic curve of the 1D1R device, which includes the characteristics of a diode and a resistive memory. Referring to the figure, the RRAM 2 of this embodiment includes the characteristics of a diode and a resistive memory (see curve c). When RRAM 2 is at a negative bias, the current is restricted and no reverse current is generated (only a small leakage current is obtained). When the RRAM 2 is at a positive bias, the current is also restricted before turning on the current. Accordingly, the range of the reading voltage can be properly controlled, so that the reading errors can be decreased as the RRAM 2 is applied to the 3D high-density crossbar structure memory cell array.

As mentioned above, the first metal oxide composite layer of the RRAM has a film layer and a nanorod structure. The first metal oxide composite layer is formed by a low-temperature process. The film layer is formed by sputtering, while the nanorod structure is formed by chemical bath deposition or hydrothermal method. Since these processes including sputtering, chemical bath deposition and hydrothermal method are performed at room temperature, so that the fabrication of the RRAM of the invention is simpler and has lower cost. In addition, the RRAM of the invention includes the characteristics of diode and resistive memory. In other words, the same structure of the device of the invention can serve as a memory or a diode so as to achieve the application of one diode-one resistive memory. Compared with the conventional art, the operation voltage and resistance states of the RRAM of the invention are more stable, and the operation voltage thereof is smaller, which decreases the power consumption.

Although the invention has been described with reference to specific embodiments, this description is not meant to be construed in a limiting sense. Various modifications of the disclosed embodiments, as well as alternative embodiments, will be apparent to persons skilled in the art. It is, therefore, contemplated that the appended claims will cover all modifications that fall within the true scope of the invention.

What is claimed is:

1. A resistive random access memory, comprising:
   a first electrode;
   a second electrode opposite to the first electrode; and
   a first metal oxide composite layer disposed between the first electrode and the second electrode, wherein the first metal oxide composite layer has a film layer and a nanorod structure.

2. The resistive random access memory of claim 1, wherein the nanorod structure comprises a plurality of nanorods, and the longitudinal axis of at least one of the nanorods is substantially perpendicular to the film layer.

3. The resistive random access memory of claim 1, wherein at least part of the nanorod structure is disposed between the second electrode and the film layer.

4. The resistive random access memory of claim 1, wherein the material of the film layer and the nanorod structure comprises ZnO, NiO, $TiO_2$, $CuO_X$, $WO_X$, $FeO_X$, $HfO_2$, $TaO_X$ or $SrTiO_X$.

5. The resistive random access memory of claim 1, wherein the film layer and the nanorod structure are made of the same material or different materials.

6. The resistive random access memory of claim 1, wherein the film layer has a first thickness ranged between 25 nm and 200 nm.

7. The resistive random access memory of claim 1, wherein the nanorod structure has a second thickness ranged between 50 nm and 500 nm.

8. The resistive random access memory of claim 1, wherein the film layer is disposed on the first electrode by sputtering.

9. The resistive random access memory of claim 1, wherein the nanorod structure is disposed on the film layer by chemical bath deposition or hydrothermal method.

10. The resistive random access memory of claim 1, wherein the material of the first electrode and the second electrode comprises Pt, Pd, Os, Ir, Rh, Ru, Ti, Cu, Al, Ni, Au, Ag, or their combinations.

* * * * *